United States Patent
K. V. et al.

(10) Patent No.: US 12,392,843 B2
(45) Date of Patent: Aug. 19, 2025

(54) SYSTEM AND METHOD FOR MANAGING A BATTERY PACK

(71) Applicant: EXICOM TELE-SYSTEMS LIMITED, Gurgaon (IN)

(72) Inventors: Sundaraaman K. V., Bangalore (IN); Narayan Surendra Mahipati, Bangalore (IN); Tanishq Choudhary, Bangalore (IN); Sudharshan Reddy Godi, Bangalore (IN); Krishna Prasad TL, Bangalore (IN); Naresh Kumar, Bangalore (IN); Rishir Kumar, Bangalore (IN)

(73) Assignee: EXICOM TELE-SYSTEMS LIMITED, Gurgaon (IN)

( * ) Notice: Subject to any disclaimer, the term of this patent is extended or adjusted under 35 U.S.C. 154(b) by 437 days.

(21) Appl. No.: 17/761,558

(22) PCT Filed: Sep. 24, 2020

(86) PCT No.: PCT/IN2020/050815
§ 371 (c)(1),
(2) Date: Mar. 17, 2022

(87) PCT Pub. No.: WO2021/059294
PCT Pub. Date: Apr. 1, 2021

(65) Prior Publication Data
US 2022/0221524 A1 Jul. 14, 2022

(30) Foreign Application Priority Data
Sep. 25, 2019 (IN) .............................. 201911038615

(51) Int. Cl.
*G01R 31/396* (2019.01)
*G01R 31/3842* (2019.01)
*G01R 31/392* (2019.01)

(52) U.S. Cl.
CPC ....... *G01R 31/396* (2019.01); *G01R 31/3842* (2019.01); *G01R 31/392* (2019.01)

(58) Field of Classification Search
CPC . G01R 31/396; G01R 31/392; G01R 31/3842
See application file for complete search history.

(56) References Cited

U.S. PATENT DOCUMENTS

| 11,309,717 B2 * | 4/2022 | Ramachandran ... H02J 7/00036 |
| 2004/0113586 A1 | 6/2004 | Chen |

(Continued)

FOREIGN PATENT DOCUMENTS

EP 2956329 12/2018

OTHER PUBLICATIONS

International Search Report received in PCT/IN2020/050815, mailed Jan. 12, 2021, 3 pages.

(Continued)

*Primary Examiner* — Lisa M Caputo
*Assistant Examiner* — Nyla Gavia
(74) *Attorney, Agent, or Firm* — Klarquist Sparkman, LLP

(57) ABSTRACT

A system and method for managing a battery pack is provided. The system includes a detection unit in communication with the battery pack. The detection unit includes a plurality of sensors configured to detect operational, mechanical and status parameters of the battery pack. A battery management unit (BMU) is configured to determine the operational, mechanical and status parameters of the battery pack based on the received data from the detection unit. A server in communication with the BMU is configured to compare the received data from the BMU with trained operational, mechanical and status parameters and instruct the BMU to perform at least one action in response to a determination of at least one of the received operational, (Continued)

mechanical and status parameters deviating from the trained operational, mechanical and status parameters of the battery pack.

18 Claims, 4 Drawing Sheets

(56) References Cited

U.S. PATENT DOCUMENTS

| | | | | |
|---|---|---|---|---|
| 2012/0038473 | A1* | 2/2012 | Fecher | H02J 7/005 |
| | | | | 340/455 |
| 2012/0161707 | A1 | 6/2012 | Kim | |
| 2012/0297215 | A1* | 11/2012 | Saba | G06F 1/3203 |
| | | | | 713/320 |
| 2014/0225620 | A1* | 8/2014 | Campbell | B60L 58/12 |
| | | | | 324/426 |
| 2015/0153810 | A1* | 6/2015 | Sasidharan | G06F 1/329 |
| | | | | 713/320 |
| 2015/0293183 | A1* | 10/2015 | Tenmyo | G01R 31/392 |
| | | | | 324/429 |
| 2017/0099350 | A1* | 4/2017 | Song | H04L 47/808 |
| 2017/0329638 | A1* | 11/2017 | Ragupathi | G06F 1/30 |

OTHER PUBLICATIONS

Written Opinion received in PCT/IN2020/050815, mailed Jan. 12, 2021, 6 pages.

* cited by examiner

SYSTEM AND METHOD FOR MANAGING A BATTERY PACK

CROSS REFERENCE TO RELATED APPLICATIONS

This is the U.S. National Stage of International Application No. PCT/IN2020/050815 filed Sep. 24, 2020, which was published in English under PCT Article 21(2), which in turn claims the benefit of India Application No. 201911038615, filed in India Sep. 25, 2019. Both applications are incorporated herein in their entirety by reference.

FIELD OF THE INVENTION

The present invention relates to a field of battery packs and more particularly relates to a system and method for managing a battery pack.

BACKGROUND OF THE INVENTION

Owing to depletion of fossil fuels and environmental hazards caused by the usage of fossil fuels, batteries are predominantly being used as energy sources in applications such as transportation, telecom, and the like. Generally, batteries include a plurality of battery cells connected in series and placed within a battery pack. Installment and usage of the batteries is an arduous task, and the batteries are to be monitored constantly to ensure efficient operation.

A Battery Management System (BMS), mounted within the battery pack, in communication with multiple sensors is configured to monitor and control the plurality of battery cells to ensure the plurality of battery cells are operating in a safe operating condition. Multiple sensors are placed within the battery pack to measure various parameters which are essential for the operation of the battery pack.

On receiving data pertaining to the various parameters, the BMS processes the information to ensure efficient operation of the battery pack. However, during situations when additional features are required to be implemented in the BMS to ensure improved operation of the battery pack, the embedded environment of the BMS falls short in terms of computational capabilities. Further, there is a lot of data being monitored and stored at the BMS. The memory of the BMS may not have the capacity to store such huge monitored historic data. If the BMS is configured to store the historic data, then the cost and the size of the BMS may increase accordingly. These limitations may be overcome by using advanced computational resources in the BMS which consequently increase the cost. Further, usage of advanced computational resources also results in a risk to the operation of the core functions/features of the BMS itself, due to additional computations and processing time. Due to the additional computation and processing time taken by BMS during situation as discussed above, may lead to risk in decreased efficiency in operation of the core functions/features of the battery pack such as, monitoring and controlling the plurality of battery cells. Failure to efficiently monitor and control the battery cells by the BMS may result in an unsafe environment for the user of the battery pack and the surrounding.

Further, it is a well understood fact that the cost of the electric vehicle is majorly based on cost of the battery. Hence, there have been situations of battery theft. Pursuant to stealing the battery pack, the BMS is disabled. By doing so, the battery pack may become untraceable, especially since the battery is not that conspicuous. In this regard, users who have invested in an electric vehicle may incur huge loss. To prevent any third party from accessing the BMS, tamper proof casing is generally provided around the battery pack or around portions including the BMS. The tamper proof casing increases the weight, thereby the cost and the size of the battery pack.

Further, due to the high cost of the battery packs, people may rent them from companies for a time period. During these situations, companies may not have a clue as to how the battery is being utilized by the person unless a physical examination of the same is done, which again is cumbersome and not feasible for the companies.

In addition, during manufacturing and installation phases of battery packs, it is a general practice to provide battery packs with similar specifications irrespective of users from different backgrounds. Due to hardware and computation limitations, it may not be feasible for the battery companies to configure each battery pack as per different requirements of users during course of usage. In order to reconfigure the battery packs, the user would be required to schedule a visit to the service center which may not be feasible and a time-consuming task.

Further, when the battery pack is in transit mode, i.e. when the battery pack is being transported from the factory to the customer, the battery pack should ideally be operating in low power consumption mode. However, that may not be the case. In this regard, by the time the battery pack reaches the customer, the charge may not be sufficient to ensure that battery pack can be used as soon as it reaches the customer.

In view of the above, there is a need for an efficient battery pack and associated Battery Management System.

SUMMARY OF THE INVENTION

One or more embodiments of the present invention, provides system and method for managing a battery pack.

In one aspect of the invention, a system for managing a battery pack is provided. The system comprises a detection unit in communication with the battery pack. The detection unit including a plurality of sensors configured to detect operational, mechanical and status parameters of the battery pack. A battery management unit (BMU) in communication with the detection unit and a user device, configured to determine the operational, mechanical and status parameters of the battery pack based on the received data from the detection unit; and scan for an authenticated communication link. A server in communication with the BMU, the server configured to periodically receive the data pertaining to at least one of, the operational, mechanical and status parameters of the battery pack from the BMU in response to establishing the authenticated communication link with the BMU. Further, the server is configured to compare the received data with trained operational, mechanical and status parameters. The server is further configured to instruct the BMU to perform at least one action in response to a determination of at least one of the received operational, mechanical and status parameters deviating from the trained operational, mechanical and status parameters of the battery pack based on the comparison.

In yet another aspect of the invention, a battery pack is provided. The battery pack comprises a detection unit including a plurality of sensors configured to detect operational, mechanical and status parameters of the battery pack. The battery pack further comprises a battery management unit (BMU) in communication with the detection unit, configured to determine the operational, mechanical and status parameters of the battery pack based on the received data from the detection unit. The BMU is further configured to scan for an authenticated communication link with a server. The BMU transmits the determined operational, mechanical and status parameters to the server, in response to an establishment of an authenticated communication link between the BMU and a server and simultaneously delete the transmitted data thereof at a memory of the BMU. The BMU also performs at least one action on the battery pack, the at least one action received from the server in response to the server determining of at least one of the operational, mechanical and status parameters deviating from trained operational, mechanical and status parameters of the battery pack. The BMU further is configured to configure the battery pack to operate in a low power consumption mode in response to at least one of the operational, mechanical and status parameters crossing a tolerable threshold limit, subsequent to failure to establish the authenticated communication link with the server, the tolerable threshold limited is one of massive surge in current within the battery pack damaging one or more cells of the battery pack. The battery pack also includes a venting apparatus machined on the battery pack adapted to rupture to allow gases to escape from within the battery pack to atmosphere during instances of pressure build up within the battery pack.

In yet another aspect of the invention, a method for managing a battery pack is provided. The method comprises the steps of detecting by a plurality of sensors of a detection unit, operational, mechanical and status parameters of the battery pack by a plurality of sensors of a detection unit; determining by a battery management unit (BMU), the operational, mechanical and status parameters of the battery pack; scanning by the BMU, an authenticated communication link with a server, periodically receiving by the server, the data pertaining to at least one of, the operational, mechanical and status parameters of the battery pack from the BMU; comparing by the server, the received data with the trained operational, mechanical and status parameters; and instructing the BMU by the server, to perform at least one action in response to a determination of at least one of the received operational, mechanical and status parameters deviating from the trained operational, mechanical and status parameters of the battery pack based on the comparison.

Other features and aspects of this invention will be apparent from the following description and the accompanying drawings. The features and advantages described in this summary and in the following detailed description are not all-inclusive, and particularly, many additional features and advantages will be apparent to one of ordinary skill in the relevant art, in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

Reference will be made to embodiments of the invention, examples of which may be illustrated in the accompanying figures. These figures are intended to be illustrative, not limiting. The accompanying figures, which are incorporated in and constitute a part of the specification, are illustrative of one or more embodiments of the disclosed subject matter and together with the description explain various embodiments of the disclosed subject matter and are intended to be illustrative. Further, the accompanying figures have not necessarily been drawn to scale, and any values or dimensions in the accompanying figures are for illustration purposes only and may or may not represent actual or preferred values or dimensions. Although the invention is generally described in the context of these embodiments, it should be understood that it is not intended to limit the scope of the invention to these particular embodiments.

DETAILED DESCRIPTION OF THE INVENTION

Reference will now be made in detail to specific embodiments or features, examples of which are illustrated in the accompanying drawings. Wherever possible, corresponding or similar reference numbers will be used throughout the drawings to refer to the same or corresponding parts. References to various elements described herein, are made collectively or individually when there may be more than one element of the same type. However, such references are merely exemplary in nature. It may be noted that any reference to elements in the singular may also be construed to relate to the plural and vice-versa without limiting the scope of the invention to the exact number or type of such elements unless set forth explicitly in the appended claims. Moreover, relational terms such as first and second, and the like, may be used to distinguish one entity from the other, without necessarily implying any actual relationship or between such entities.

Various embodiments of the invention provide system and method for managing a battery pack. The present invention is configured to provide system and method for managing a battery pack by ensuring efficiency of the battery pack is maintained.

Figure 1:
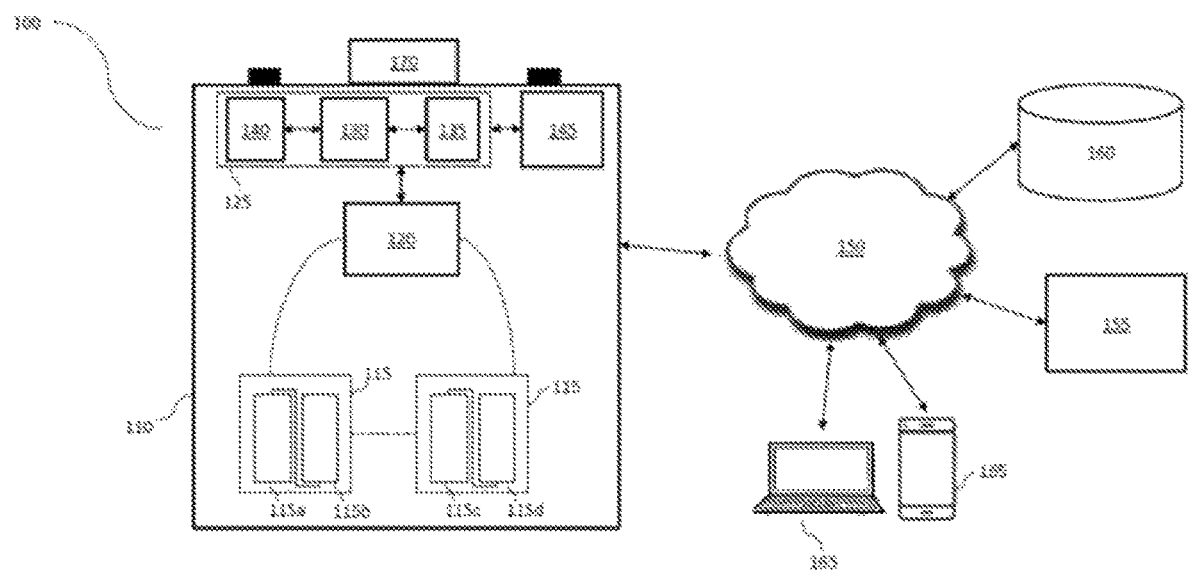
FIG. 1 illustrates a block diagram of a system for managing a battery pack, in accordance with one or more embodiments of the present invention.
Figure 2:
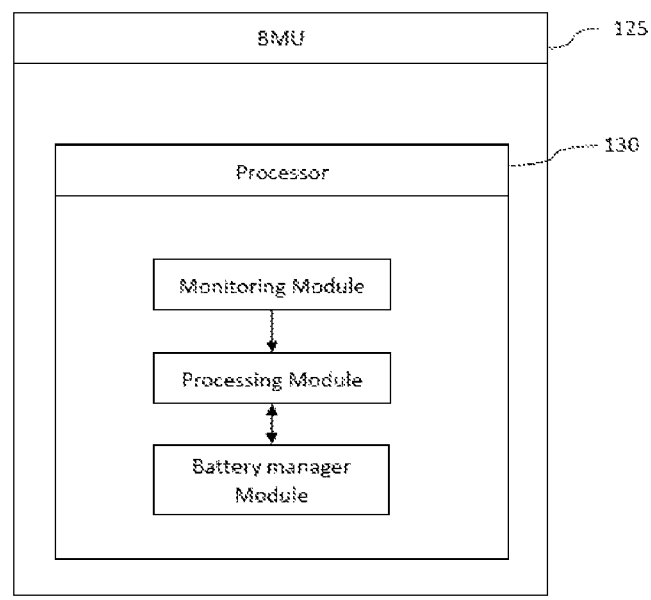
FIG. 2 illustrates various modules present within a battery management unit (BMU) of a system of FIG. 1.

In accordance with one or more embodiments of the present invention, FIG. 1 illustrates a block diagram of a system 100 for managing at least one battery pack. The system 100 includes a smart battery pack 110, a detection unit 120, Battery Management Unit (BMU) 125, a server 155, a storage unit 160, a user device 165 and a communications network 150. The smart battery pack 110 is hereinafter referred to as a battery pack 110.

In an embodiment, instead of a single battery pack 110, multiple battery packs may be connected to one another in series or parallel or operating as a standalone unit depending on the required power for a specific application. For instance, for an electric vehicle, the power required may be greater than for a telecom tower. Hence, the number of battery packs have to be accordingly connected. In another embodiment, the battery pack 110 is a portable battery. In yet another embodiment, the battery pack 110 is a swappable battery.

The battery pack 110 includes a plurality of battery cells 115 connected with one another in one of a series connection and a parallel connection. As per the illustrated embodiment, a first battery cell 115a and a second battery cell 115b of the plurality of battery cells 115 is connected with one another in a series connection forming a first set of the plurality of battery cells 115. Similarly, a third battery cell 115c and a fourth battery cell 115*d* are connected with one another in a series connection forming a second set of the plurality of battery cells 115. The first set of the plurality of battery cells 115 and the second set of the plurality of battery cells 115 are thereafter connected in parallel to provide energy as a whole.

In another embodiment, the first battery cell 115*a* and the third battery cell 115*c* is connected with one another in a parallel connection forming the first set of plurality of battery cells 115. Likewise, the second battery cell 115*b* and the fourth battery cell 115*d* is connected with one another in a parallel connection forming the second set of plurality of battery cells 115. The first set of the plurality of battery cells 115 and the second set of the plurality of battery cells 115 are thereafter connected in series to provide energy.

In another embodiment, each of the first battery cell 115*a* and the second battery cell 115*b* of the first set of the plurality of battery cells 115 and the third battery cell 115*c* and the fourth battery cell 115*d* of the second set of the plurality of battery cells 115 are connected with one another in series connection. In yet another embodiment, each of the first battery cell 115*a* and the second battery cell 115*b* of the first set of the plurality of battery cells 115 and the third battery cell 115*c* and the fourth battery cell 115*d* of the second set of the plurality of battery cells 115 are connected to one another in a parallel connection. Although the present invention is described with respect to the first, the second, the third, and the fourth battery cell 115*a*, 115*b*, 115*c*, 115*d* respectively and the first set and the second set of the plurality of battery cells 115 respectively, the specific number of battery cells and the number of sets of the battery cells connected in series or parallel as described herein is purely for exemplary purpose and also may vary depending on the type of application for which they are used. Therefore, nowhere should this illustrated embodiment be construed as limited the scope of the present disclosure.

Each of the first, the second, the third, and the fourth battery cell 115*a*, 115*b*, 115*c*, 115*d* is configured to be used as an energy source for various applications in fields such as transportation, telecom and the like. Each of the first, the second, the third, and the fourth battery cell 115*a*, 115*b*, 115*c*, 115*d* is one of, but not limited to, a lead acid battery, lithium-ion battery, nickel metal hydride battery.

In accordance with an embodiment of the invention, the detection unit 120 includes multiple sensors configured to detect and monitor various operational parameters of each of the first battery cell 115*a*, the second battery cell 115*b*, the third battery cell 115*c*, and the fourth battery cell 115*d*. The multiple sensors may include at least one of or a combination of, a current sensor, a voltage sensor, an impedance sensor, an accelerometer, a hygrometer, a GPS sensor, a thermocouple, a gas sensor, a strain sensor, a pressure sensor, and a dimensional sensor. The detection unit 120 is configured to detect and monitor operational parameters and mechanical parameters of each of the first battery cell 115*a*, the second battery cell 115*b*, the third battery cell 115*c*, and the fourth battery cell 115*d*, respectively. The detection unit 120 is further configured to detect and monitor status parameters pertaining to internal and/or external status of the battery pack 110. The operational parameters include at least one of, but not limited to, voltage, current, impedance, and charge. The mechanical parameters include at least one of, but not limited to, displacement, pressure, state of charge, state of health, acceleration, strain, tension, and, location. The status parameters pertaining to the internal and/or external status of the battery pack include at least one of, but not limited to, gas (e.g., CO, CO2) emission, and internal temperature of the battery pack 110 and/or ambient/external temperature surrounding the battery pack 110.

The system 100 further includes the BMU 125. In one embodiment, the BMU 125 may include at least one processor 130, an input/output (I/O) interface unit 135, and a memory 140. Further, in one embodiment, the detection unit 120 is present within the BMU 125. The at least one processor 130 may be implemented as one or more microprocessors, microcomputers, microcontrollers, digital signal processors, central processing units, state machines, logic circuitries, and/or any devices that manipulate signals based on operational instructions. Among other capabilities, the at least one processor 130 is configured to fetch and execute computer-readable instructions stored in the memory 140.

The I/O interface unit 135 may include a variety of software and hardware interfaces, for example, a web interface, a graphical user interface, Light Emitting Diode (LED) and the like.

The memory 140 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

In the preferred embodiment, the BMU 125 is an integral part of the battery pack 110. In alternate embodiments, the BMU 125 may be located at a remote location accessible to the user via the user device.

In one embodiment, each of the multiple sensors of the detection unit 120 is configured to periodically detect the operational parameters, mechanical parameters and status parameters pertaining to internal and/or external status of the battery pack 110. In another embodiment, each of the multiple sensors of the detection unit 120 is configured to detect the operational parameters, mechanical parameters and status parameters pertaining to internal and/or external status of the battery pack 110 based on user demand and/or in response to an occurrence of a pre-defined event. Consequently, in one embodiment, the processor 130 stores the data related to operational parameters, mechanical parameters and parameters pertaining to internal and/or external status as detected by the detection unit 120 of the battery pack 110 in the memory 140 along with a time stamp.

The BMU 125 is configured to receive the detected operational, mechanical and status parameters of the battery pack. In an embodiment, the BMU 125 receives the detected operational, mechanical and status parameters periodically. In an alternate embodiment, the BMU 125 receives the detected parameters in the event of an occurrence of a pre-defined event.

Once the BMU 125 receives the detected parameters, the BMU 125 determines the operational, mechanical and status parameters of the battery pack. For example, the detection unit 120 includes a current sensor configured to sense operational parameter current generated by the battery pack 110. The current sensor, consequently, transmits the information to a monitoring module of the processor 130 of the BMU 125. The processing module of the processor 130 processes the information to determine the current generated by the battery pack 110 in real time, and thereafter stores the processed information in the memory 140. In another example, once the detection unit 120 senses mechanical parameters, the corresponding information is transmitted to the BMU 125 which is received by the monitoring module of the processor 130. The processing module of the processor 130 processes the information to determine mechanical parameters such as, but not limited to, state of charge (SOC), state of health (SOH) and the like of the battery pack 110, and further stores the same in the memory 140. More specifically, the processing module determines the charge acceptance, internal resistance, voltage, and self-discharge of the battery pack 110, and as a result calculates the State of Health (SOH) of the battery pack 110. Likewise, the processing module assesses the SOH, temperature, voltage, summation of current discharged from battery pack 110 to determine the State of charge (SOC) of the battery pack 110.

Once the BMU 125 determines the operational, mechanical and status parameters, the BMU 125 scans for an authenticated communication link with a registered server. In an alternate embodiment, the BMU 125 scans for the authenticated communication link via a transceiver 145. In another alternate embodiment, the BMU 125 instructs the transceiver 145 to scan for the authenticated communication link. In an embodiment, the registered server is shown in FIG. 1. The BMU 125 keeps scanning until it identifies the registered server 155 and thereafter establishes an authenticated communication link with the registered server 155 over the communications network 150. In an embodiment, the authenticated communication link is established by the BMU 125 with the server 155 based on transmitting a request to receive the server's unique ID. In response to receiving the unique ID from the server, the BMU 125 verifies the authenticity of the unique ID and also checks if the BMU 125 has sufficient permission to communicate with the server 155 based on cross-checking with the pre-stored server information at the BMU 125. In the event, the BMU 125 fails to establish the authenticated communication link with the server 155, then the BMU 125 configures the battery pack 110 such that the battery pack operates in the low power consumption mode in response to at least one of the determined operational, mechanical and status parameters crossing a tolerable threshold limit. In an embodiment, the tolerable threshold limited is one of a massive surge in current within the battery pack which may damage one or more battery cells 115a, 115b, 115c, and 115d. On detection, the processing module communicates with the battery manager module to configure the battery pack such that the battery pack operates in the low power consumption mode. In other words, the battery pack will shift to a safe state during this situation . . . .

Further during the event when the BMU 125 or the transceiver 145 fails to establish the authenticated communication link with the server 155, the BMU 125 is configured to receive messages and/or instructions from the user via the user device using Short Message Service (SMS). In this regard, the BMU 125 or the transceiver 145 ensures that the response is sent to the user via SMS. Advantageously, by doing so ensures that the user is constantly updated of the whereabouts of the battery pack irrespective of establishment of the authenticated communication link with the server 155. In an embodiment, the user number (phone number) of the user can be authorized initially from the server 155 side.

In one embodiment, when the connection between the BMU 125 and the server 155 is lost, the BMU 125 stores the data accumulated in the memory 140 until the connection between the BMU 125 and the server 155 is restored. Once the connection is restored, the accumulated data is transmitted to the storage unit 160 by the BMU 125 via the transceiver 145.

In an embodiment, the BMU 125 is configured to authenticate a charger before charging the battery pack 110.

In yet another embodiment, the BMU 125 is configured to send an instruction to the charger regarding demand current based upon temperature and voltage of the battery pack 110. In yet another embodiment, the BMU 125 is configured to notify the user in case of wrong charger used or plugged-in. The BMU 125 is also configured to cut-off connection with the charger when the charger is faulty or not behaving ideally.

Although this embodiment is described with respect to data obtained from the current sensor, it should not be construed as a limitation and should be understood that the processor 130 is configured to monitor and control the battery pack 110 in response to data obtained from various other sensors as well.

Further, in the event the BMU 125 establishes the authenticated communication link with the server 155, then the transceiver 145 of the battery pack 110 transmits the data pertaining to the determined operational parameters, mechanical parameters and status parameters of the battery pack 110 to the server 155 over the communications network 150 periodically and/or in response to an occurrence of a pre-defined event and/or based on user demand. In one embodiment, once the data related to the various parameters are transmitted from the BMU 125 to the server 155 via the transceiver 145, copy of the relevant data is automatically deleted at the memory 140. By doing so, ensures that the memory 140 is not accumulated with previously stored data which is already transmitted to the server 155. Advantageously, the BMU 125 is not burdened with large volume of data beyond the capacity of the BMU 125, thereby ensuring that effective monitoring service is provided.

In an embodiment, the transceiver 145 may be any suitable transmitter and/or receiver. For example, the transceiver 145 may be configured to up-convert a signal to transmit the signal via an antenna and/or to receive a signal from the antenna and down-convert the signal and provide it to the server 155. The transceiver 145 may facilitate multiple communications within a wide variety of networks and protocol types, including wired networks, for example, LAN, cable, etc., and wireless networks, such as WLAN, cellular, satellite, NBIOT and LORAWAN.

The server 155 is in communication with the BMU 125 via the communication network 150. In one embodiment, a Secure Hardware Extension (SHE) unit is embedded within the battery pack 115. The SHE unit ensures that secured communication of data takes place between the BMU 125 and the server 155, thereby preventing third party access to data. In an embodiment, the communications networks 150 can include wired and/or wireless connections such as, but not limited to, local area network (LAN), Bluetooth, Near Field Communication (NFC), NBIOT, LORAWAN, infrared, WIFI, GPRS, LTE, Edge and the like.

In one embodiment, the server 155 receives the data in real time. In another embodiment, the server 155 receives the data at pre-set time intervals. In another embodiment, the server 155 receives the data in response to occurrence of a pre-defined event. The server 155 further stores the data as received in a storage unit 160. The server 155 includes information related to the data as stored in the storage unit 160. On receiving the data, the server 155 computes the data and configures the battery pack 110 remotely so as to ensure the battery pack 110 operates in an efficient manner.

In an embodiment, the server 155 is configured to compare the received operational, mechanical and status parameters with trained operational, mechanical and status parameters. Pursuant to the comparison, the server 155 instructs the BMU 125 to perform at least one action in response to a determination of at least one of the received operational, mechanical and status parameters deviating from trained operational, mechanical and status parameters of the battery pack 110.

In an embodiment, the trained operational, mechanical and status parameters are derived based on at least one of an initial pre-set operational, mechanical and status parameters and learnt operational, mechanical and status parameters respectively.

In an embodiment, a training and learning module may be stored at the storage unit 160 or the server 155. The training and learning module is configured to generate the data pertaining to the trained operational, mechanical and status parameters.

Figure 3:
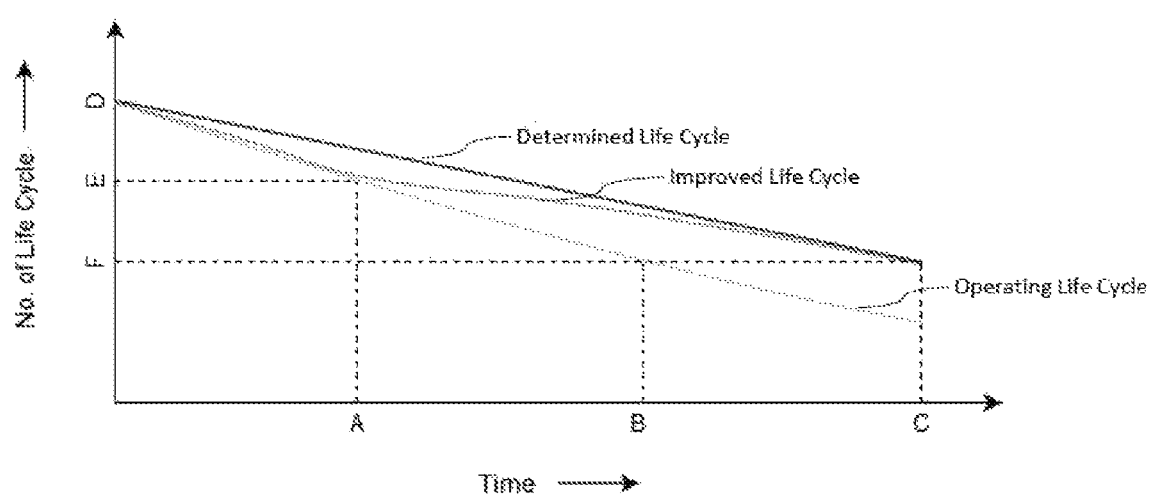
FIG. 3 illustrates a life cycle curve of the battery pack.

In an embodiment, the initial pre-set operational, mechanical and status parameters are those with associated data which are pre-set by the user of the battery pack. In an embodiment, the user herein may be the manufacturer of the battery pack 110. These initial pre-set parameters are set by the user (manufacturer) based on lab characteristic testing data and drive cycle. In an embodiment, the lab characteristic testing data includes the operational, mechanical and status parameters obtained when the battery pack is used in ideal and/or normal conditions in a testing environment. Further, the drive cycle may include the electric vehicle being tested in all modes such as, but not limited to, sport mode (harsh mode), eco mode, etc. of the battery pack. Taking into consideration, the initial pre-set parameters, a life cycle of the battery pack is determined. The life cycle of the battery pack is depicted as a life cycle curve as shown in FIG. 3 by the server 155. In an embodiment, typical life cycle of the Li-ion battery pack may be in the range of 700-900 cycles.

During operation of the battery pack, the operational, mechanical and status parameters are periodically received by the server 155. The server 155 plots an operating life cycle curve as shown in FIG. 3 based on the received operational, mechanical and status parameters. In an embodiment, the operating life cycle of the battery pack is plotted by the server 155 when the electric vehicle is in motion which is using the battery pack 155. In the event, the operating life cycle of the battery pack deviates from the determined life cycle, the server 155 is configured to instruct the BMU 125 to perform at least one action of tuning at least one of the operational parameters such as, but not limited to, operating current, operating temperature, voltage threshold of the battery pack in order to ensure the operating life cycle is in conformity with the determined life cycle. Advantageously, by doing so efficient operation of the battery pack is enhanced and the battery pack operates in the range of the determined life cycle. In an example embodiment as illustrated in FIG. 3, "D" is the determined life cycle. "F" indicates the end-of-life cycle of the battery pack. Once the user starts using the battery pack, the operating curve illustrates that the battery pack is degrading sooner than expected. "D-E" is a point at time "A" when the server 155 depicts that the battery pack's life is reduced and the server 155 is configured to tune the operational parameter to extend the operating life cycle of the battery pack in order to confirm with the determined life cycle. In the event the parameters cannot be tuned, then the operating life cycle of the battery pack would be at time "B" instead of "C".

Based upon the data stored on the server, over a period of time which may be pre-set by the user, the server is configured to set different learnt parameters and/or profiles for each driving patterns of the user (herein the user may be the current driver of the electric car and/or owner of the electric vehicle) such as, but not limited to, sport mode, eco mode etc. Further, the server is configured to monitor and store any updated learnt parameters of the battery pack during the operation of the battery pack. Further, any warranty implications that can arise due to the learnt parameters can also be achieved by the server 155.

In an embodiment, the learnt operational, mechanical and status parameters are periodically updated and derived by the server 155 based on one of, but not limited to, usage of the battery pack, life of the battery pack, environment of usage of the battery pack, type of battery cells within the battery pack, type of application for which the battery pack 110 is used, driving pattern of the user (herein the user may be the current driver of the electric car and/or owner of the electric vehicle). Further, the learnt parameters are automatically updated based on newly determined characteristics/parameters compared to training parameters previously stored in the storage unit 160 and/or the server 155. In turn, the trained parameters also get automatically updated due to updated learnt parameters.

In an embodiment, the server 155 instructs the BMU 125 to perform the at least one action which could include at least one of the following actions:

In an embodiment, the at least one action may include the server 155 instructing the BMU 125 to charge one or more cells 115 of the battery pack 110 for a time period which is determined by the server 155. The server 155 determines the time period to charge the battery cells in response to an operational voltage which is part of the operational parameter of the one or more cells being below a trained operational voltage parameter of the battery pack. In particular, the detection unit 125 detects the current and voltage generated by the battery cells 115*a*, 115*b*, 115*c*, and 115*d* and transmits the information to the monitoring module of the BMU. The processing module processes the information to determine the operating voltage of each of the battery cells 115*a*, 115*b*, 115*c*, and 115*d*. If one or more of the battery cells 115*a*, 115*b*, 115*c*, 115*d* is operating at a voltage below the trained operational voltage, then the server 155 assumes that there is a battery cell imbalance condition. In such situations, the server 155 determines a time required to balance the at least one battery cell 115*a*, 115*b*, 115*c*, and 115*d* diagnosed as imbalanced cell. The server 155 determines the time required to balance the at least one battery cell by assessing the state of charge, the state of health, the voltage, the current, and state of the battery cell, i.e., charging or idle.

In another embodiment, the at least one action may include the server 155 instructing the BMU 125 to activate back-up charge quotient of the battery pack 110 to assist the user to reach a charging station in response to a battery charge level fallen below a critical level.

In another embodiment, the at least one action may include the server 155 instructing the BMU 125 to immobilize the battery pack in response to one of user's instruction on reporting a theft and based on determination of the battery pack 110 located in an unknown territory. During this situation, based on the location of the battery pack 110 as determined by the server 155, if the server 155 determines that the location of the battery pack 110 is in an unknown territory, the server 155 sends a signal to a battery manager module of the processor 130 via the communication network 150 to immobilize the battery pack 115, and thereby render it ineffective. In yet another embodiment, the server 155 configures the battery pack 110 to adapt to different ranges of ambient temperature based on the battery pack 110 located in different territories. In particular, pursuant to determining the location of the battery pack as disclosed above, if the server 155 identifies that the battery pack 110 is in a specific territory, the server 155 based on trained status parameter, i.e. ambient range of temperature corresponding to the specific territory, the server 155 transmits a signal to the battery manager module of the BMU 125 to configure the operating temperature of the battery pack 110 to adapt to the ambient temperature of the specific territory. The specific territory may be one of, but not limited to, hot, cold, rainy, windy, snowy climates whose ambient temperature ranges are different compared to the ideal ambient operating temperature range of the battery pack 110. Further, in instances such as the battery pack 110 entering a specific territory for a short time which is not covered by the allocated server 155, then the server 155 may transmit a signal to the BMU 125 to configure the time range to ensure that the allocated server 155 can remotely monitor the battery pack 110 even when the battery pack 110 has been located in the territory which is not covered by the allocated server 155.

In yet another embodiment, the server 155 is configured to transmit a ship mode instruction to the BMU 125. The ship mode instruction will ensure that the battery pack operates with least power consumption when in transit. The transit may be when the battery pack is being transported from the factory to the customer. The transit may be identified by the server based on location of the battery pack as received from the BMU. The server 155 will check for pre-stored locations of the factory and/or pre-stored path from the factory to the customer and thereby gauge that the battery pack may be in transit. Advantageously, this ensures to prevent any fake theft issues since the location may change.

In another embodiment, the at least one action may include the server 155 instructing the BMU 125 to configure the battery pack to adapt to an ambient temperature range from a pre-configured operating temperature range in response to determination of a location of the battery pack shifting to the unknown territory from an operating territory.

In an embodiment, the server 155 is further configured to determine cause of damage to the battery pack 110 based on data received from the BMU 125 pertaining to location, orientation and speed of the battery pack 110. In particular, the server 155 is configured to determine location of the battery pack 110 by using signal triangulation in addition to Global Positioning Systems (GPS). In particular, each of the GPS, the accelerometer and the gyroscope transmit data to the monitoring module of the processor 130. Thereafter, the processing module processes the data and stores the same in the memory 140. The transceiver 145 transmits the processed data to the server 155. On receiving, the server 155 is configured to determine the location, the speed, and the orientation of the battery pack 110. As such, when the user of the battery pack 110 claims damage to the battery pack 110 and requires the battery pack 110 to be replaced under warranty, service center may access the server 155 to obtain information regarding cause of the damage. From determined data received from the accelerometer (speed), gyroscope (orientation) and GPS (location), if the cause of the damage is identified to have been caused due to mishandling of the battery pack 110 by the user/owner, then the warranty claim may be denied. In another embodiment, the BMU 125 will also receive a signal indicative of the damage caused as transmitted by the server 155.

In another embodiment, the server 155 is configured to notify the user of a current state of the battery pack 110 pertaining to duration of time the battery pack 110 is required to be charged to ensure efficiency of the battery pack 110 is enhanced. In particular, the server 155 in response to receiving data pertaining to various parameters of the battery pack 110, the server 155 provides notifications to the user as to how efficiency of the battery pack 110 is enhanced and not compromised. Examples of the notifications include, how long should the battery pack 110 be charged when there is a requirement of charging and the like. Further, in case the battery charge level in the battery pack 110 is fallen below a critical level, the server 155 instructs the processing module of the processor 130 to activate a back-up charge/reserve quotient to assist the user to reach a recharge station.

In another embodiment, the server 155 is configured to instantaneously provide predictive alerts to the user on the user device of a plurality of recommendations to ensure the trained parameters of the battery pack are maintained based on one of, the usage of the battery pack, the life of the battery pack, the type of battery cells within the battery pack, type of application, previous actions taken by the server in response to similar received data of operational, mechanical and status parameters from the BMU 125 and instructions received by the user during similar situations. Advantageously, by doing so reduces the computation steps and increases the speed of the server 155 and the BMU 125 in determining any event as disclosed herein. The predictive alerts are provided by the server 155 by utilizing the learnt behavior by the training and learning module.

In yet another embodiment of the invention, the server 155 on detection of malware is configured to update over the air/remotely without requiring manual intervention and the battery pack need not be recalled to a service center. In particular, malware may be detected by the server 155 when the various parameters such as operational, mechanical and parameters pertaining to internal and/or external status of the battery pack 110 are operating abnormally and deviating from trained parameters of the battery pack 110. In situations such as this, the server 155 may assume that there is malware present within the battery pack 110 and/or the BMU 125, thereby update over the air/remotely without requiring manual intervention. In another embodiment, the server 155 may notify the user to recall the battery pack 110 in case over the update/remote updating is not possible.

In another embodiment, owing to inactivity of the battery pack 110, the BMU 125 embedded within the battery packs 110 tends to switch to a sleep mode. In such situations the server 155 is configured to ping, or more specifically transmit an echo request to, the processor 130 of the BMU 125 and thereby wake up the BMU 125 as per the user's requirement and/or based on type of application such as, when vehicle is in motion and/or periodic pre-set time intervals. The BMU 125 embedded within the battery pack can be remotely and/or manually one of, configured to power on, powered off, sleep and wake-up based on the user requirements.

With reference to FIG. 1, a registered and/or authenticated user is allowed to receive notifications and/or updates in real time and/or periodically via a user device 165. The notifications and/or updates is one of, but not limited to, state of charge, state of health, power available, battery life, speed of the battery, operational, mechanical and internal and/or external status of the battery pack as disclosed herein above. In one embodiment, the user device 165 is embedded with a viewer module to connect with the server 155. The viewer module provides a user interface on the user device 165 to receive and/or view notifications/updates and/or notify the server by way of instructions based on user requirements. In another embodiment, the user is allowed to directly access the battery pack 110 via the communications network 150. The user device 165 is one of, but not limited to, a laptop, a mobile phone, tablet, PDA and an on-board user interface unit of a vehicle.

In addition, the battery pack 110 includes a venting apparatus 170 machined onto the battery pack 110. The venting apparatus 170 includes a venting membrane. The venting membrane is adapted to rupture to allow gases to escape from within the battery pack 110 to atmosphere during instances of pressure build up within the battery pack 110.

The venting apparatus 170 is adapted to be positioned proximal to one or more battery cells which are susceptible to thermal runaway. During instances of thermal runaway, inflammable gases are generated within the battery pack 110, and there is a pressure build up therein. Failure of timely release of the gases generated therein leads to explosion of the battery pack 110. As the pressure builds up within the battery pack 110, ruptures are formed on the venting membrane of the venting apparatus 170. As such, the gases generated within the battery pack 110 escapes quickly to the atmosphere.

In another embodiment, in applications where the venting apparatus 170 cannot be positioned proximal to the one or more battery cells, then a channel is formed. One end of the channel is located proximal to the one or more battery cells susceptible to damage and other end of the channel is coupled to the pressure vent 170, thereby enabling quickest escape of gases to the atmosphere.

At least few of the features and technical advantages of the present invention are listed hereunder:

Transfer of data related to operational parameters, mechanical parameters, and internal state of the battery pack from the BMU to the server in real time;

Availability of trained data to instantaneously predict state of the battery cells within the battery pack;

Configure the battery cells based on the training data;

Faster computation of the data to ensure efficient performance of the battery pack;

Over the air updates; and

The operating voltage of the BMU embedded within the battery pack can be configured to function in various ranges of voltage.

Figure 4:
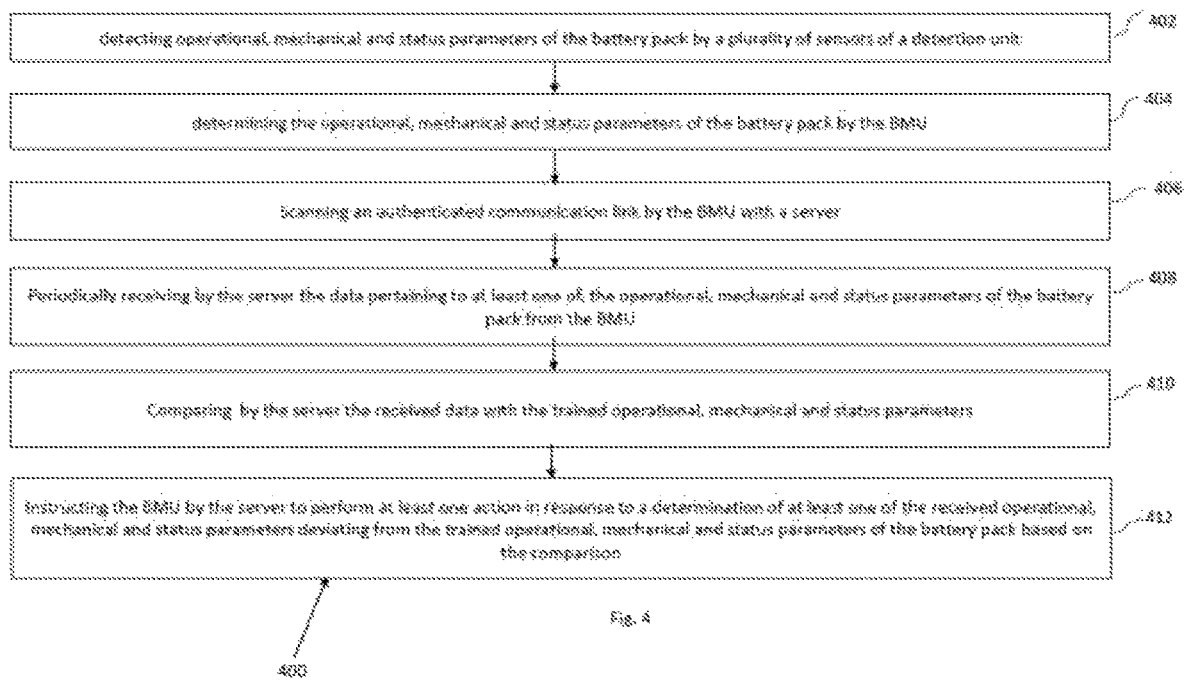
FIG. 4 shows a flowchart of a method for managing at least one battery pack, in accordance with one or more embodiments of the present invention.

FIG. 4 shows a flowchart of a method 400 for managing at least one battery pack, according to one or more embodiments of the present invention. The method 400 is illustrated with reference to FIG. 1 of the system 100. The method 400 comprises the steps as indicated below:

At step 402, a plurality of sensors of a detection unit detect, operational, mechanical and status parameters of the battery pack.

At step 404, a battery management unit (BMU) determines, the operational, mechanical and status parameters of the battery pack.

At step 406, the BMU scans for an authenticated communication link with a server.

At step 408, the server periodically receives, the data pertaining to at least one of, the operational, mechanical and status parameters of the battery pack from the BMU.

At step 410, the server compares, the received data with the trained operational, mechanical and status parameters.

At step 412, the server instructs the BMU, to perform at least one action in response to a determination of at least one of the received operational, mechanical and status parameters deviating from the trained operational, mechanical and status parameters of the battery pack based on the comparison.

While aspects of the present invention have been particularly shown and described with reference to the embodiments above, it will be understood by those skilled in the art that various additional embodiments may be contemplated by the modification of the disclosed machines, systems and methods without departing from the scope of what is disclosed. Such embodiments should be understood to fall within the scope of the present invention as determined based upon the claims and any equivalents thereof.

The invention claimed is:

1. A system for managing a battery pack, the system comprising:
   a detection unit in communication with the battery pack, the detection unit including a plurality of sensors configured to detect operational, mechanical and status parameters of the battery pack;
   a battery management unit (BMU) in communication with the detection unit and a user device, wherein the BMU is configured to:
      determine the operational, mechanical and status parameters of the battery pack based on received data from the detection unit; and
      scan for an authenticated communication link; and
   a server in communication with the BMU, wherein the server is configured to:
      periodically receive the data pertaining to at least the operational, mechanical or status parameters of the battery pack from the BMU in response to establishing the authenticated communication link with the BMU;
      compare the received data with trained operational, mechanical and status parameters; and
      instruct the BMU to perform at least one action in response to a determination of at least the received operational, mechanical or status parameters deviating from the trained operational, mechanical or status parameters of the battery pack based on the comparison;
   wherein the server instructs the BMU to perform the action, and the action comprises:
   balancing one or more cells of the battery pack for a time period determined by the server in response to an operation voltage of the one or more cells being below a trained operational voltage of the battery pack;
   activating a back-up charge quotient of the battery pack to assist a user to reach a charging station in response to a battery charge level fallen below a critical level;
   immobilizing the battery pack in response to a user's instruction or based on determination of the battery pack being located in an unknown territory; or
   configuring the battery pack to adapt to an ambient temperature range from a trained operating temperature range in response to determination of a location of the battery pack shifting to the unknown territory from an operating territory.

2. The system as claimed in claim 1, wherein the plurality of sensors comprise:
   a current sensor,
   a voltage sensor,
   an impedance sensor,
   an accelerometer,
   a hygrometer,
   a GPS sensor,
   a thermocouple, a gas sensor,
a strain sensor,
a pressure sensor, or
a dimensional sensor.

3. The system as claimed in claim 1, wherein the operational parameters of the battery pack comprise:
voltage,
current,
impedance or
charge.

4. The system as claimed in claim 1, wherein the mechanical parameters of the battery pack comprise:
displacement,
pressure,
state of charge (SOC),
state of health (SOH),
acceleration,
strain,
tension or
location.

5. The system as claimed in claim 1, wherein the status parameters of the battery pack comprise:
gas emission,
internal temperature within the battery pack or
ambient temperature surrounding the battery pack.

6. The system as claimed in claim 1, wherein the BMU is configured to configure the battery pack to operate in a low power consumption mode in response to at least one of the operational, mechanical or status parameters crossing a tolerable threshold limit subsequent to failure to establish the authenticated communication link with the server, wherein the tolerable threshold limit comprises a massive surge in current within the battery pack damaging one or more cells of the battery pack.

7. The system as claimed in claim 1, wherein the user comprises:
a driver of an electric vehicle,
a customer,
a manufacturer or
an owner.

8. The system as claimed in claim 1, wherein the trained operational, mechanical and status parameters are derived based on at least:
a pre-set initial operational parameter;
a pre-set mechanical parameter;
a pre-set status parameter;
a learnt operational parameter;
a learnt mechanical parameter; or
a learnt status parameter.

9. The system as claimed in claim 8, wherein the learnt parameters are periodically updated and derived based on:
usage of the battery pack,
life cycle of the battery pack,
environment of the usage of the battery pack,
type of battery cells within the battery pack,
type of application, or
driving patterns of the user.

10. The system as claimed in claim 1, wherein the server is further configured to at least:
determine cause of damage to the battery pack based on data received from the BMU pertaining to location, orientation and speed of the battery pack;
notify the user of a current state of the battery pack pertaining to duration of time the battery pack is required to be charged to ensure efficiency of the battery pack is enhanced; or
instantaneously provide predictive alerts to the user of a plurality of recommendations to ensure the trained parameters of the battery pack are maintained based on usage of the battery pack, life of the battery pack, type of battery cells within the battery pack, type of application, previous actions taken by the server in response to similar received data of operational, mechanical and status parameters from the BMU, instructions received by the user during similar situations or drive pattern of the user.

11. The system of claim 1, wherein the action comprises:
balancing one or more cells of the battery pack for a time period determined by the server in response to an operation voltage of the one or more cells being below a trained operational voltage of the battery pack.

12. The system of claim 1, wherein the action comprises:
activating a back-up charge quotient of the battery pack to assist the user to reach a charging station in response to a battery charge level fallen below a critical level.

13. The system of claim 1, wherein the action comprises:
tuning at least one of the operational parameters including current, temperature and voltage threshold in order to ensure an operating life cycle of the battery pack is in conformity with a determined life cycle of the battery pack.

14. The system of claim 1, wherein the action comprises:
immobilizing the battery pack in response to a user's instruction or based on determination of the battery pack being located in an unknown territory.

15. The system of claim 1, wherein the action comprises:
configuring the battery pack to adapt to an ambient temperature range from a trained operating temperature range in response to determination of a location of the battery pack shifting to the unknown territory from an operating territory.

16. A battery pack comprising:
a detection unit including a plurality of sensors configured to detect operational, mechanical and status parameters of the battery pack;
a battery management unit (BMU) in communication with the detection unit, configured to:
determine the operational, mechanical and status parameters of the battery pack based on received data from the detection unit;
scan for an authenticated communication link with a server;
transmit the determined operational, mechanical and status parameters to the server, in response to an establishment of an authenticated communication link between the BMU and a server and simultaneously delete the transmitted data thereof at a memory of the BMU;
perform at least one action on the battery pack, the at least one action received from the server in response to the server determining of at least the operational, mechanical or status parameters deviating from trained operational, mechanical and status parameters of the battery pack, wherein the action comprises (a), (b), (c), or (d):
(a) balancing one or more cells of the battery pack for a time period determined by the server in response to an operation voltage of the one or more cells being below a trained operational voltage of the battery pack;
(b) activating a back-up charge quotient of the battery pack to assist a user to reach a charging station in response to a battery charge level fallen below a critical level;

(c) immobilizing the battery pack in response to a user's instruction or based on determination of the battery pack being located in an unknown territory; or (d) configuring the battery pack to adapt to an ambient temperature range from a trained operating temperature range in response to determination of a location of the battery pack shifting to the unknown territory from an operating territory; and configure the battery pack to operate in a low power consumption mode in response to at least one of the operational, mechanical and status parameters crossing a tolerable threshold limit, subsequent to failure to establish the authenticated communication link with the server, the tolerable threshold limit comprises a massive surge in current within the battery pack damaging one or more cells of the battery pack; and a venting apparatus machined on the battery pack adapted to rupture to allow gases to escape from within the battery pack to atmosphere during instances of pressure build up within the battery pack.

17. A method for managing a battery pack, wherein the method comprises:

detecting by a plurality of sensors of a detection unit, operational, mechanical and status parameters of the battery pack by a plurality of sensors of a detection unit;

determining by a battery management unit (BMU), the operational, mechanical and status parameters of the battery pack;

scanning by the BMU, an authenticated communication link with a server;

periodically receiving by the server, data pertaining to at least the operational, mechanical or status parameters of the battery pack from the BMU;

comparing by the server, the received data with trained operational, mechanical and status parameters; and instructing the BMU by the server, to perform at least one action in response to a determination of at least one of the received operational, mechanical or status parameters deviating from the trained operational, mechanical or status parameters of the battery pack based on the comparison;

wherein the action comprises:

balancing one or more cells of the battery pack for a time period determined by the server in response to an operation voltage of the one or more cells being below a trained operational voltage of the battery pack;

activating a back-up charge quotient of the battery pack;

immobilizing the battery pack in response to a user's instruction or based on determination of the battery pack being located in an unknown territory; or configuring the battery pack to adapt to an ambient temperature range from a trained operating temperature range in response to determination of a location of the battery pack shifting to the unknown territory from an operating territory.

18. The method of claim 17, wherein the method further comprises:

after the data pertaining to at least the operational, mechanical or status parameters of the battery pack are received by the server, deleting the data from the BMU.

* * * * *